(12) United States Patent
Yang et al.

(10) Patent No.: US 6,727,155 B1
(45) Date of Patent: Apr. 27, 2004

(54) METHOD FOR SPIN ETCHING SIDEWALL SPACERS BY ACID VAPOR

(75) Inventors: Jiunn-Der Yang, Hsinchu (TW); Chaucer Chnug, Hsin Chu (TW); Yuan-Chang Huang, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/323,349

(22) Filed: Dec. 18, 2002

(51) Int. Cl.[7] .............................................. H01L 21/331
(52) U.S. Cl. ........................ 438/366; 438/303; 438/766
(58) Field of Search .......................... 438/366, 303–305, 438/704, 184, 230, 595

(56) References Cited

U.S. PATENT DOCUMENTS 5,661,052 A * 8/1997 Inoue et al. ................ 438/303
6,274,512 B1 * 8/2001 Hayashi et al. ............. 438/766

* cited by examiner

Primary Examiner—Dung A. Le
(74) Attorney, Agent, or Firm—Tung & Associates

(57) ABSTRACT

A method forming sidewall spacers on a semiconductor substrate without using the conventional plasma etching method is disclosed. In the method, a semiconductor substrate that has a gate structure formed on a top surface is first provided, followed by the deposition of a dielectric material layer on top of the semiconductor substrate. The substrate is then rotated to a rotational speed of at least 50 rpm, and an acid vapor is flown onto the substrate until the sidewall spacers are formed. The dielectric material layer for forming the sidewall spacers may be $SiO_2$, $SiON$ or $Si_3N_4$. The acid vapor utilized may be formed from an acid of HF, $H_3PO_4$, $H_2SO_4$ or HCl. In a preferred embodiment, the semiconductor substrate may be rotated to a rotational speed between about 100 rpm and about 150 rpm for a time period between about 10 sec. and about 20 sec.

18 Claims, 1 Drawing Sheet

METHOD FOR SPIN ETCHING SIDEWALL SPACERS BY ACID VAPOR

FIELD OF THE INVENTION

The present invention generally relates to a method for forming sidewall spacers on a semiconductor substrate and more particularly, relates to a method for forming sidewall spacers of a dielectric material on a silicon wafer by spin etching with an acid vapor such that plasma damages to the silicon substrate can be avoided.

BACKGROUND OF THE INVENTION

Modern semiconductor devices are built on semiconducting substrates such as silicon substrates that have $P^+$ and $N^+$ type doped regions in the substrates as basic elements of the device. These doped regions must be connected in a specific configuration to form a desired circuit. The circuit needs to be accessible to the outside world through conducting pads for testing and through bonding into a packaged chip. To form a semiconductor circuit, at least one layer of a conducting material such as metal must be deposited and patterned to form contacts and interconnects between the different regions of the chip. For instance, in a typical semiconductor fabrication process, a silicon wafer is first covered with an insulating layer and then, patterned and etched for contact openings in the insulating layer. A conductive material is then deposited and defined to form contact plugs and interconnecting leads.

On top of a silicon wafer, semiconductor gates are normally formed of a polysilicon material with a thin gate oxide layer in-between the polysilicon gate and the silicon substrate. A typical semiconductor gate structure 10 is shown in FIGS. 1A and 1B. In order to insulate the polysilicon gate 12, a silicon oxide layer 14 or any other dielectric material layer such as silicon nitride or silicon oxynitride is deposited on top. A thick silicon oxide layer of several thousand angstrom thickness can be deposited by a rapid thermal chemical vapor deposition (RTCVD) technique. In the process for forming the sidewall spacers 16 from the dielectric layer 14, it is important that the material deposited, i.e. silicon oxide, must have both a high deposition rate such that a thick layer can be deposited in a short period of time and a good conformability such that the polysilicon gate can be completely covered. For instance, when silicon oxide is deposited, the TEOS (tetra-ethoxy-silane) chemistry can be used at a high deposition temperature of 800° C. for achieving a deposition rate of about 1000 Å/min. The high deposition rate satisfies a throughput requirement for the semiconductor device. The high deposition temperature limits the deposition process to the front end of the semiconductor fabrication wherein metal wiring layers are not involved.

After the conformal deposition of the silicon oxide layer 14 to approximately 5000–8000 Å thickness, a reactive ion etching (RIE) method is used to pattern the gate sidewall spacers 16. The RIE technique is chosen since the anisotropic plasma used in the technique is effective in forming the sidewall spacers 16 on the gate 12. In the RIE technique, positive plasma ions in a parallel-plate RF reactor are used to provide a source of energetic particle bombardment for the etched surface, producing vertical edges in the etched film with negligible undercutting. The ion bombardment increases the reaction rate of spontaneously occurring processes and prompts reactions which do not occur without radiation. In a typical reactive ion etching system, the wafers are placed on the powered electrode of a parallel-plate RF reactor wherein horizontal surfaces are subjected to both reactant species and impinging ions, while vertical sidewalls are only subjected to reactive species.

In the conventional method of patterning sidewall spacers by the reactive ion etching method, it has been discovered that the plasma ions bombarded during the etching process damage the silicon surface at the source/drain area that will enhance dark current (or leakage current) and impact the signal/noise ratio of a photoelectronic device. As shown in FIG. 1E, a surface layer 18 of the silicon substrate 20 in the source/drain area 22,24 is frequently damaged by the plasma ions which severely affects the reliability of the device fabricated.

It is therefore an object of the present invention to provide a method for forming sidewall spacers on a polysilicon gate without the drawbacks or shortcomings of the conventional reactive ion etching method.

It is another object of the present invention to provide a method for forming sidewall spacers on a polysilicon gate that does not cause plasma damages in the source/drain area of the silicon substrate.

It is a further object of the present invention to provide a method for forming sidewall spacers on a polysilicon gate without using reactive ion etching or plasma etching for patterning the spacers.

It is another further object of the present invention to provide a method for forming sidewall spacers on a polysilicon gate by utilizing a spin mode acid vapor etching technique.

It is still another object of the present invention to provide a method for forming sidewall spacers on a polysilicon gate by flowing an acid vapor onto a semiconductor wafer while spinning the wafer at a rotational speed of at least 50 rpm.

It is yet another object of the present invention to provide a method for etching dielectric spacers on a silicon substrate without causing plasma damages to the substrate by utilizing a spin mold acid vapor etching technique.

It is still another further object of the present invention to provide a method for etching dielectric spacers on a silicon substrate without causing plasma damages to the substrate by first annealing and densifying the dielectric material before subjecting the substrate to an acid vapor while being rotated at a speed of at least 50 rpm.

It is yet another further object of the present invention to provide a method for etching dielectric spacers on a silicon substrate without causing plasma damages to the substrate wherein the spacers are formed of $SiO_2$, $SiON$ or $Si_3N_4$ and the acid vapor is HF, $H_3PO_4$, $H_2SO_4$ or HCl.

SUMMARY OF THE INVENTION

In accordance with the present invention, a method for forming sidewall spacers on a semiconductor substrate or a method for etching dielectric spacers on a silicon substrate without causing plasma damages to the silicon substrate is provided.

In a preferred embodiment, a method for forming sidewall spacers on a semiconductor substrate can be carried out by the operating steps of first providing a semiconductor substrate that has a gate structure formed on top; depositing a dielectric material layer on top of the semiconductor substrate; rotating the semiconductor substrate to a rotational speed of at least 50 rpm; and flowing an acid vapor onto the semiconductor substrate until the sidewall spacers are formed.

The method for forming sidewall spacers on a semiconductor substrate may further include the step of mounting the semiconductor substrate on a wafer chuck situated in a spin etcher. The dielectric material layer may be formed of a material selected from the group consisting of $SiO_2$, SiON and $Si_3N_4$. The semiconductor substrate may be a silicon wafer, and the gate structure may be formed for a photoelectronic device. The method may further include the step, subsequent to the deposition step, of annealing the semiconductor substrate at a temperature of at least 700° C. for a time period of at least 10 min. The method may further include the step of annealing the semiconductor substrate at a temperature between about 700° C. and about 800° C. for a time period between about 10 min. and about 20 min. after the depositing step. The method may further include the step of flowing an acid vapor formed of an acid selected from the group consisting of HF, $H_3PO_4$, $H_2SO_4$ and HCl onto the semiconductor substrate. The method may further include the step of rotating the semiconductor substrate to a rotational speed between about 50 rpm and about 200 rpm. The method may further include the step of rotating the semiconductor substrate to a rotational speed between about 100 rpm and about 150 rpm for a time period between about 10 sec. and about 20 sec.

The present invention is further directed to a method for etching dielectric spacers on a silicon substrate without causing plasma damages to the silicon substrate which can be carried out by the steps of first providing a silicon substrate with a gate structure formed on top; depositing a dielectric material layer on top of the silicon substrate; annealing the dielectric material layer at a temperature of at least 700° C. for a time period of at least 10 min; rotating the silicon substrate to a rotational speed of at least 50 rpm; and flowing an acid vapor onto the silicon substrate and etching the dielectric material layer into dielectric spacers.

The method for etching dielectric spacers on a silicon substrate without causing plasma damages to the substrate may further include the step of depositing the dielectric material layer from a material selected from the group consisting of $SiO_2$, SiON and $Si_3N_4$. The method may further include the step of mounting the silicon substrate on a wafer chuck situated in a spin etcher, or the step of forming the gate structure for a photoelectronic device, or the step of annealing the dielectric material layer at a temperature between about 700° C. and about 800° C. for a time period between about 10 min. and about 20 min. The method may further include the step of flowing an acid vapor formed of an acid selected from the group consisting of HF, $H_3PO_4$, $H_2SO_4$ and HCl onto the semiconductor substrate. The method may further include the step of rotating the semiconductor substrate to a rotational speed between about 50 rpm and about 200 rpm. The method may further include the step of rotating the semiconductor substrate to a rotational speed between about 100 rpm and about 150 rpm for a time period between about 10 sec. and about 20 sec.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming sidewall spacers on a semiconductor substrate which can be carried out by first providing a semiconductor substrate that has a gate structure formed on a top surface. A dielectric material layer is then deposited on top of the semiconductor substrate, followed by a step of rotating the substrate to a speed of at least 50 rpm, and then flowing an acid vapor onto the substrate until the sidewall spacers are formed.

The invention further discloses a method for etching dielectric spacers from $SiO_2$, SiON or $Si_3N_4$ on a silicon substrate without causing plasma damages to the substrate. In the method, a silicon substrate-that has a gate structure formed on a top surface is first provided, followed by the deposition of a dielectric material layer on top of the silicon substrate. The dielectric material layer is then annealed at a temperature of at least 700° C. for a time period of at least 10 min., followed by rotating the substrate to a speed of at least 50 rpm and flowing an acid vapor onto the substrate for etching the dielectric material layer into dielectric spacers.

The present invention spin mode acid vapor wet etch method replaces the conventional plasma dry etch method and thus prevents damages from occurring to the silicon surface at the source/drain areas. In order to extend the process window for the spacer patterning process, an optional step of high temperature densifying for the spacer dielectric film may also be utilized. For instance, the dielectric material film may be annealed at a temperature between about 700° C. and about 800° C. for a time period between about 10 min. and about 15 min. The word "about" used in this writing indicates a range of values that is ±10% from the average value given. The advantages of the present invention novel method have been proven in image sensing devices fabricated wherein, by using HF vapor wet etch, the leakage current (or the dark current) is reduced by about 60% while the signal/noise ratio is improved by about 107% when compared to devices fabricated by the conventional plasma dry etch method.

Figure 1A:
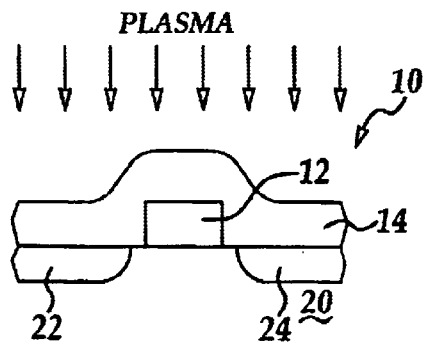
FIGS. 1A and 1B are enlarged, cross-sectional views illustrating a conventional method for forming sidewall spacers by a reactive ion etching technique.
Figure 1B:
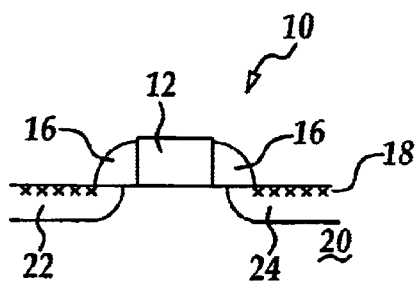
Figure 2A:
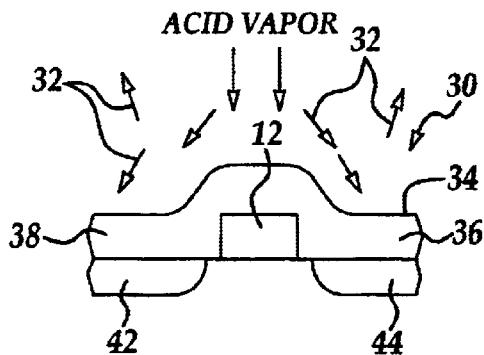
FIGS. 2A and 2B are enlarged, cross-sectional view of the present invention method for forming sidewall spacers by a spin mode acid vapor etching technique.
Figure 2B:
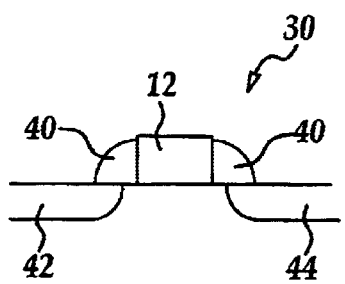

Referring now to FIGS. 2A and 2B wherein a present invention semiconductor gate structure 30 is shown. By utilizing a spin mode acid vapor etch technique, the acid vapor 32 attacks a top surface 34 of the dielectric material layer 36 in a uniform manner and thus, without directly bombarding the silicon substrate surface 38. After sidewall spacers 40 are formed on the polysilicon gate 12, the source/drain areas 42, 44 are not damaged by the acid vapor 32 that was applied during the spin etching operation.

Figure 3:
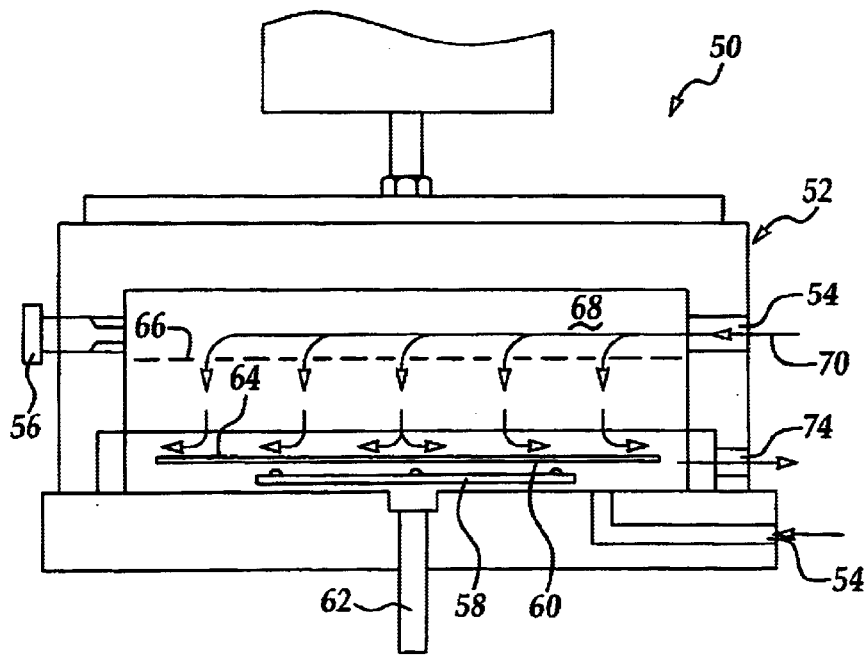
FIG. 3 is a cross-sectional view of a spin etcher used in the present invention novel etching method.

A cross-sectional view of the spin etcher 50 utilized in the present invention novel spin mode acid vapor etching technique is shown in FIG. 3. The spin etcher 50 is constructed of a chamber body 52, a process gas inlet 54, a pressure transducer 56, a vacuum chuck 58 for holder a wafer 60 thereon, a shaft 62 for rotating the vacuum chuck 58 and the wafer 60, and an exhaust gas outlet 74. It is seen that the process gas 70 enters the chamber cavity 68 and then flows through a perforated membrane 66 onto the top surface 64 of the wafer 60 while being rotated at a suitable rotational speed.

During the etching process, an inert gas such as $N_2$ is purged in-between the wafer 60 and the vacuum chuck 58 by flowing into the chamber through process gas inlet 54. The process gas 70 flown into the etch chamber 68 may be from an acid of HF, $H_3PO_4$, $H_2SO_4$ or HCl. The wafer 60 is suitably rotated to a rotational speed between about 50 rpm and about 200 rpm, and preferably between about 100 rpm and about 150 rpm. The process time required for etching the dielectric spacers may be between about 10 sec. and about 20 sec., and preferably between about 12 sec. and about 15 sec. when the wafer is rotated at a speed of 120 rpm.

It has been discovered that the present invention process can be further enhanced by pre-annealing the semiconductor substrate, i.e. the silicon wafer, at a temperature between about 700° C. and about 800° C. for a time period between about 10 min. and about 20 min. after the deposition of the dielectric material layer on top of the polysilicon gate.

The present invention novel method for etching dielectric spacers on a silicon substrate without causing plasma damages to the substrate can therefore be carried out by the following steps:

1. providing a silicon substrate that has a gate structure formed on a top surface;
2. depositing a dielectric material layer such as $SiO_2$, SiON or $Si_3N_4$ on top of the silicon substrate;
3. annealing the dielectric material layer at a temperature of at least 700° C. for a time period of at least 10 min;
4. rotating the silicon substrate to a rotational speed of at least 50 rpm;
5. flowing an acid vapor onto the silicon substrate and etching the dielectric material layer into dielectric spacers; and
6. implanting the source/drain region.

It has been found that when sensitive semiconductor devices are fabricated, i.e. such as image sensors, any surface damage in the silicon layer can lead to high leakage current and high signal/noise ratio. The present invention novel method solves both of these processing difficulties by eliminating the use of plasma bombardment of the silicon surface. The effectiveness of the present invention novel method, i.e. in comparison to the prior art method of plasma dry etch and partial plasma dry etch/wet bench etch, is shown below in Table 1.

TABLE 1

| Spacer Etch Method | Advantages | Disadvantages |
| --- | --- | --- |
| Plasma Dry Etch | Anisotropy etch, good process control | Si surface damage at source/drain area |
| Partial Dry Etch + (1500 Å) Wet Bench Etch (500 Å) | Prevent Si surface damage at source/drain area | Extra wet etch step and difficult control for wet etch |
| Spin Mode Acid Vapor Etch | Prevent Si surface damage of source/drain area, and easier control than wet etch | Need vapor etch hardware for better control of vapor etch process. |

The effectiveness of the present invention novel acid vapor etch method is shown in Table 2 comparing to the conventional plasma dry etch and dry etch+wet etch technique.

TABLE 2

| | Wafers | Leakage Current | S/N Ratio |
| --- | --- | --- | --- |
| Vapor Spin Etch | #1 | 33.26 | 2.388 |
| | #2 | 28.89 | 2.323 |
| | #3 | 31.21 | 2.301 |
| Dry Etch + | #4 | 33.57 | 1.670 |

TABLE 2-continued

| | Wafers | Leakage Current | S/N Ratio |
| --- | --- | --- | --- |
| Wet HF | #5 | 42.13 | 1.601 |
| | #6 | 32.71 | 1.563 |
| Plasma Dry Etch | #7 | 72.09 | 1.160 |
| | #8 | 77.02 | 1.130 |
| | #9 | 84.02 | 1.038 |
| | #10 | 71.25 | 1.182 |
| Vapor Improvement avg. | | 59.10% | 107.30% |

As seen in Table 2, the present invention novel method produces a leakage current of about 30 which is substantially smaller than the dry etch/wet etch method of about 36 and the plasma dry etch method of about 76. The average improvement in the leakage current by the present invention novel technique is therefore about 59.1%. For the signal/noise ratio, the present invention novel method achieves a ratio of about 2.3, which is favorably compared to a value of about 1.6 for the dry etch/wet etch method and a value of about 1.1 for the plasma dry etch method. An improvement of about 107% is therefore achieved in the signal/noise ratio by utilizing the present invention spin mode acid vapor etch technique.

The present invention novel method for forming sidewall spacers on a semiconductor substrate by using a spin mode acid vapor etch technique has therefore been amply described in the above description and in the appended drawings of FIGS. 2A, 2B and 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming sidewall spacers on a semiconductor substrate comprising the steps of:
   providing a semiconductor substrate having a gate structure formed on top;
   depositing a dielectric material layer on top of said semiconductor substrate;
   rotating said semiconductor substrate to a rotational speed of at least 50 rpm; and
   flowing an acid vapor onto said semiconductor substrate until said sidewall spacers are formed.

2. A method for forming sidewall spacers on a semiconductor substrate according to claim 1 further comprising the step of mounting the semiconductor substrate on a wafer chuck situated in a spin etcher.

3. A method for forming sidewall spacers on a semiconductor substrate according to claim 1, wherein said dielectric material layer being formed of a material selected from the group consisting of $SiO_2$, SiON and $Si_3N_4$, SiCON, SiCo and SiC.

4. A method for forming sidewall spacers on a semiconductor substrate according to claim 1, wherein said semiconductor substrate is a silicon wafer.

5. A method for forming sidewall spacers on a semiconductor substrate according to claim 1, wherein said gate structure is formed for a photoelectronic device.

6. A method for forming sidewall spacers on a semiconductor substrate according to claim 1 further comprising the step, subsequent to said depositing step, of annealing said semiconductor substrate at a temperature of at least 700° C. for a time period of at least 10 min.

7. A method for forming sidewall spacers on a semiconductor substrate according to claim 1 further comprising the step of annealing said semiconductor substrate at a temperature between about 700° C. and about 800° C. for a time period between about 10 min. and about 20 min. after said depositing step.

8. A method for forming sidewall spacers on a semiconductor substrate according to claim 1 further comprising the step of flowing an acid vapor formed of an acid selected from the group consisting of HF, $H_3PO_4$, $H_2SO_4$, and HCl onto said semiconductor substrate.

9. A method for forming sidewall spacers on a semiconductor substrate according to claim 1 further comprising the step of rotating said semiconductor substrate to a rotational speed between about 50 rpm and about 200 rpm.

10. A method for forming sidewall spacers on a semiconductor substrate according to claim 1 further comprising the step of rotating said semiconductor substrate to a rotational speed between about 100 rpm and about 150 rpm for a time period between about 10 sec. and about 20 sec.

11. A method for etching dielectric spacers on a silicon substrate without causing plasma damages to the silicon substrate comprising the steps of:

providing a silicon substrate with a gate structure formed on top;

depositing a dielectric material layer on top of said silicon substrate;

annealing said dielectric material layer at a temperature of at least 700° C. for a time period of at least 10 min;

rotating said silicon substrate to a rotational speed of at least 50 rpm; and flowing an acid vapor onto said silicon substrate and etching said dielectric material layer into dielectric spacers.

12. A method for etching dielectric spacers on a silicon substrate without causing plasma damages to the silicon substrate according to claim 11 further comprising the step of depositing said dielectric material layer from a material selected from the group consisting of $SiO_2$, SiON and $Si_3N_4$.

13. A method for etching dielectric spacers on a silicon substrate without causing plasma damages to the silicon substrate according to claim 11 further comprising the step of mounting said silicon substrate on a wafer chuck situated in a spin etcher.

14. A method for etching dielectric spacers on a silicon substrate without causing plasma damages to the silicon substrate according to claim 11 further comprising the step of forming said gate structure for a photoelectronic device.

15. A method for etching dielectric spacers on a silicon substrate without causing plasma damages to the silicon substrate according to claim 11 further comprising the step of annealing said dielectric material layer at a temperature between about 700° C. and about 800° C. for a time period between about 10 min. and about 20 min.

16. A method for etching dielectric spacers on a silicon substrate without causing plasma damages to the silicon substrate according to claim 11 further comprising the step of flowing an acid vapor formed of an acid selected from the group consisting of HF, $H_3PO_4$, $H_2SO_4$ and HCl onto said semiconductor substrate.

17. A method for etching dielectric spacers on a silicon substrate without causing plasma damages to the silicon substrate according to claim 11 further comprising the step of rotating said semiconductor substrate to a rotational speed between about 50 rpm and about 200 rpm.

18. A method for etching dielectric spacers on a silicon substrate without causing plasma damages to the silicon substrate according to claim 11 further comprising the step of rotating said semiconductor substrate to a rotational speed between about 100 rpm and about 150 rpm for a time period between about 10 sec. and about 20 sec.

\* \* \* \* \*